United States Patent
Miao et al.

(10) Patent No.: US 11,107,905 B2
(45) Date of Patent: *Aug. 31, 2021

(54) VERTICAL FIELD EFFECT TRANSISTORS WITH SELF ALIGNED SOURCE/DRAIN JUNCTIONS

(71) Applicant: INTERNATIONAL BUSINESS MACHINES CORPORATION, Armonk, NY (US)

(72) Inventors: Xin Miao, Guilderland, NY (US); Chen Zhang, Albany, NY (US); Kangguo Cheng, Schenectady, NY (US); Wenyu Xu, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/653,589

(22) Filed: Oct. 15, 2019

(65) Prior Publication Data
US 2020/0044056 A1 Feb. 6, 2020

Related U.S. Application Data

(63) Continuation of application No. 15/980,111, filed on May 15, 2018, now Pat. No. 10,505,019.

(51) Int. Cl.
*H01L 21/00* (2006.01)
*H01L 21/02* (2006.01)
(Continued)

(52) U.S. Cl.
CPC .... *H01L 29/66666* (2013.01); *H01L 21/2254* (2013.01); *H01L 21/324* (2013.01);
(Continued)

(58) Field of Classification Search
CPC ........... H01L 29/66666; H01L 29/7827; H01L 29/66545; H01L 29/66553; H01L 21/311;
(Continued)

(56) References Cited

U.S. PATENT DOCUMENTS 7,230,286 B2   6/2007  Cohen et al.
9,312,383 B1   4/2016  Cheng et al.
(Continued)

OTHER PUBLICATIONS

Larrieu et al., "CMOS Inverter Based on Schottky Source-Drain MOS Technology With Low-Temperature Dopant Segregation," IEEE Electron Device Letters. vol. 32. No. 6. Jun. 2011.
(Continued)

*Primary Examiner* — Natalia A Gondarenko
(74) *Attorney, Agent, or Firm* — Tutunjian & Bitetto, P.C.; Randall Bluestone

(57) ABSTRACT

A method of controlling an effective gate length in a vertical field effect transistor is provided. The method includes forming a vertical fin on a substrate, and forming a bottom spacer layer on the substrate adjacent to the vertical fin. The method further includes forming a dummy gate block adjacent to the vertical fin on the bottom spacer layer. The method further includes forming a top spacer adjacent to the vertical fin on the dummy gate block, and removing the dummy gate block to expose a portion of the vertical fin between the top spacer and bottom spacer layer. The method further includes forming an absorption layer on the exposed portion of the vertical fin. The method further includes heat treating the absorption layer and vertical fin to form a dopant modified absorption layer, and removing the dopant modified absorption layer.

20 Claims, 8 Drawing Sheets

(51) Int. Cl.
*H01L 21/336* (2006.01)
*H01L 29/78* (2006.01)
*H01L 29/66* (2006.01)
*H01L 21/335* (2006.01)
*H01L 21/324* (2006.01)
*H01L 21/225* (2006.01)
*H01L 29/10* (2006.01)
*H01L 29/221* (2006.01)
*H01L 29/16* (2006.01)
*H01L 29/161* (2006.01)
*H01L 29/201* (2006.01)
*H01L 29/22* (2006.01)

(52) U.S. Cl.
CPC .... *H01L 29/1037* (2013.01); *H01L 29/66545* (2013.01); *H01L 29/66553* (2013.01); *H01L 29/7827* (2013.01); *H01L 29/16* (2013.01); *H01L 29/161* (2013.01); *H01L 29/1608* (2013.01); *H01L 29/201* (2013.01); *H01L 29/221* (2013.01); *H01L 29/2203* (2013.01)

(58) Field of Classification Search
CPC ........... H01L 21/31056; H01L 21/3065; H01L 21/302; H01L 21/3043; H01L 21/28562; H01L 21/28158; H01L 21/28167; H01L 21/28202; H01L 21/8232; H01L 21/823431; H01L 21/823437; H01L 21/82345; H01L 21/823456; H01L 21/823468; H01L 21/823481; H01L 21/823487; H01L 21/823821; H01L 21/823828; H01L 21/823842; H01L 21/82385; H01L 21/823857; H01L 21/823864; H01L 21/823878; H01L 21/823885; H01L 21/28211; H01L 21/28229; H01L 21/28238; H01L 29/1037; H01L 29/2203; H01L 29/16; H01L 29/1608; H01L 29/161; H01L 29/201; H01L 29/221; H01L 21/324; H01L 21/2254; H01L 29/66598; H01L 29/66803; H01L 29/66795; H01L 21/0217; H01L 21/02126; H01L 21/02164; H01L 21/30604; H01L 21/823418; H01L 29/0676; H01L 29/0649; H01L 29/41741; H01L 29/42392; H01L 29/45; H01L 29/0865–0869; H01L 29/0882–0886; H01L 29/0878; H01L 29/785; H01L 29/7851; H01L 29/78642; H01L 29/78618–78627; H01L 2029/7863; H01L 2029/7858
USPC .... 257/24, 329, E27.062, E21.632; 438/212, 438/270, 151, 294, 452, 454
See application file for complete search history.

(56) References Cited

U.S. PATENT DOCUMENTS

| | | | |
|---|---|---|---|
| 9,368,572 B1 | 6/2016 | Cheng et al. | |
| 9,379,242 B1* | 6/2016 | Lin | H01L 29/785 |
| 9,525,064 B1 | 12/2016 | Balakrishnan et al. | |
| 9,530,866 B1 | 12/2016 | Zhang et al. | |
| 9,640,636 B1* | 5/2017 | Bentley | H01L 29/66545 |
| 9,647,112 B1* | 5/2017 | Balakrishnan | H01L 29/7845 |
| 9,741,717 B1 | 8/2017 | Cheng et al. | |
| 9,761,728 B1 | 9/2017 | Cheng et al. | |
| 9,799,749 B1 | 10/2017 | Bi et al. | |
| 9,799,765 B1 | 10/2017 | Bergendahl et al. | |
| 10,164,057 B1* | 12/2018 | Jeon | H01L 29/66666 |
| 10,236,379 B2 | 3/2019 | Bentley et al. | |
| 10,505,019 B1* | 12/2019 | Miao | H01L 29/66545 |
| 2002/0009837 A1* | 1/2002 | Iwamatsu | H01L 21/28202 438/151 |
| 2008/0003725 A1* | 1/2008 | Orlowski | H01L 29/78684 438/149 |
| 2015/0279974 A1* | 10/2015 | Godet | H01L 21/30 438/283 |
| 2016/0308002 A1* | 10/2016 | Yang | H01L 29/0649 |
| 2016/0365439 A1 | 12/2016 | Lin | |
| 2019/0067474 A1 | 2/2019 | Wong et al. | |
| 2020/0220023 A1 | 7/2020 | Pillarisetty | |

OTHER PUBLICATIONS

Liu et al., "Dopant-Segregation Technique for Leakage Reduction and Performance Improvement in Trigate Transistors Without Raised Source/Drain Epitaxy," IEEE Electron Device Letters. vol. 35. No. 5. May 2014.
List of IBM Patents or Patent Applications Treated as Related dated Oct. 15, 2019, 2 pages.
Office Action dated Sep. 24, 2020 for4 U.S. Appl. No. 16/653,522, 27 pages.
U.S. Final Office Action issued in U.S. Appl. No. 16/653,522 dated Feb. 10, 2021, pp. 1-35.
Office Action dated May 10, 2021 for U.S. Appl. No. 16/653,522, 24 pages.

* cited by examiner

VERTICAL FIELD EFFECT TRANSISTORS WITH SELF ALIGNED SOURCE/DRAIN JUNCTIONS

BACKGROUND

Technical Field

The present invention generally relates to forming vertical field effect transistors (VFETs), and more particularly to controlling source and drain to vertical fin junction positions.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of controlling an effective gate length in a vertical field effect transistor is provided. The method includes forming a vertical fin on a substrate, and forming a bottom spacer layer on the substrate adjacent to the vertical fin. The method further includes forming a dummy gate block adjacent to the vertical fin on the bottom spacer layer. The method further includes forming a top spacer adjacent to the vertical fin on the dummy gate block, and removing the dummy gate block to expose a portion of the vertical fin between the top spacer and bottom spacer layer. The method further includes forming an absorption layer on the exposed portion of the vertical fin. The method further includes heat treating the absorption layer and vertical fin to form a dopant modified absorption layer, and removing the dopant modified absorption layer.

In accordance with another embodiment of the present invention, a method of controlling an effective gate length in a vertical field effect transistor is provided. The method includes forming a vertical fin layer on a substrate, wherein the vertical fin layer includes a dopant species, and forming a plurality of vertical fins from the vertical fin layer, wherein the vertical fins include the dopant species. The method further includes forming a bottom source/drain layer on the substrate adjacent to each of the plurality of vertical fins. The method further includes forming a bottom spacer layer on the bottom source/drain layer adjacent to each of the plurality of vertical fins. The method further includes forming a dummy gate block adjacent to each of the plurality of vertical fins on the bottom spacer layer, and forming a top spacer adjacent to each of the plurality of vertical fins on the dummy gate block. The method further includes removing the dummy gate blocks to expose a portion of each of the plurality of vertical fins between the top spacer and bottom spacer layer, and forming an absorption layer on the exposed portion of each of the plurality of vertical fins. The method further includes heat treating the absorption layer and plurality of vertical fins to diffuse/segregate at least a portion of the dopant species from the vertical fins to the absorption layer to form a dopant modified absorption layer.

In accordance with yet another embodiment of the present invention, a vertical field effect transistor with self-aligned source/drain junctions is provided. The vertical field effect transistor with self-aligned source/drain junctions includes a vertical fin on a substrate, wherein the vertical fin has a lower portion and an upper portion with a first dopant concentration, and a reduced dopant region between the upper portion of the vertical fin and the lower portion of the vertical fin with a second dopant concentration less than the first dopant concentration.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to utilizing a dopant adsorbent layer and controlled heat treatment to reduce or eliminate source/drain-to-fin junction variations and misalignment to maintain more consistent effective gate lengths. Use of a rapid thermal oxide growth (RTO) process to form an in-situ steam generation (ISSG) oxide layer through wet oxidation can provide a dopant adsorbent layer on the portion of a vertical fin to be covered by a vertical gate structure. Other dopant absorbent materials layers can be used for the dopant adsorbent layer based on the dopant solid solubility of the material.

Embodiments of the present invention relate generally to minimizing differences in the positioning of the electronic junction between a top or bottom source/drain and a top or bottom of a vertical fin device channel by controlling a vertical dopant profile across the interface between the top source/drain and vertical fin. Diffusion of dopants laterally outward into a dopant adsorbent layer can provide sharper dopant concentration transitions between the source/drain and the middle region of the vertical fin covered by a gate structure. A self-aligned source/drain junction can be achieved by using top and bottom spacers to position the adsorbent layer, and removing excess dopant from the middle vertical fin region adjacent to the location of a subsequently formed gate structure.

Embodiments of the present invention relate generally to removing dopants adjacent to a gate structure region to minimize the misalignment of the doped top or bottom source/drain region relative to the top or bottom edge of a vertical gate structure on the vertical fin.

Embodiments of the present invention relate generally to controlling the source/drain junctions' positions with respect to the gate, reducing effective gate length variation, forming source/drain junctions with steeper doping gradients, and improving the short channel effects.

Exemplary applications/uses to which the present invention can be applied include, but are not limited to: vertical field effect transistors, complementary metal oxide semiconductor (CMOS) devices, digital logic devices (e.g., NAND gates, NOR gates, etc.), and memory (e.g., static random access memory (SRAM)).

It is to be understood that aspects of the present invention will be described in terms of a given illustrative architecture; however, other architectures, structures, substrate materials and process features and steps can be varied within the scope of aspects of the present invention.

Figure 1:
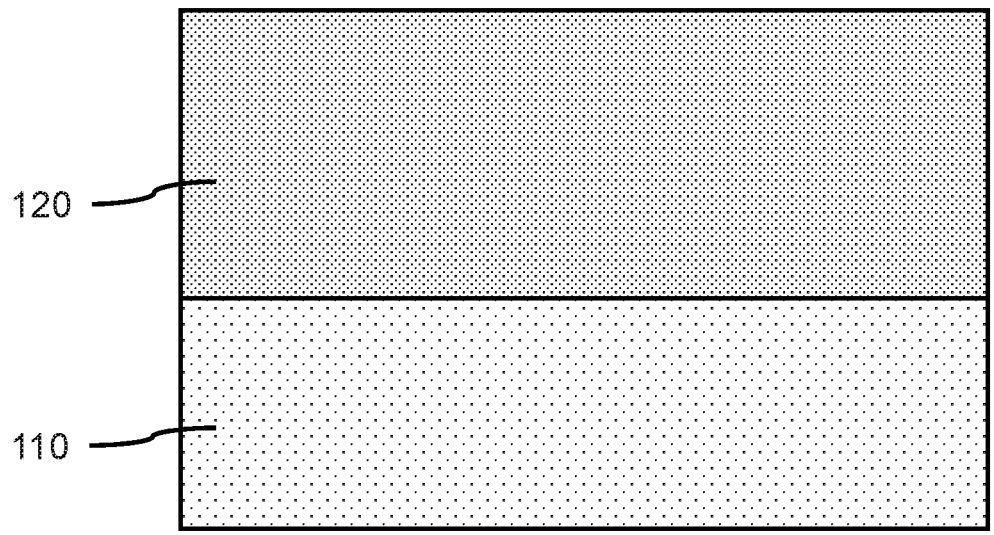
FIG. 1 is a cross-sectional side view showing a vertical fin layer on a substrate, in accordance with an embodiment of the present invention.

Referring now to the drawings in which like numerals represent the same or similar elements and initially to FIG. 1, a cross-sectional side view of a vertical fin layer on a substrate is shown, in accordance with an embodiment of the present invention.

In one or more embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)), or an implanted layer can form a buried insulating material.

The substrate 110 can include a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-gallium-arsenide (InGaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

In one or more embodiments, a vertical fin layer 120 can be formed on the substrate 110, where the vertical fin layer 120 can be formed by an epitaxial growth method on the substrate 110, for example, by reduced pressure chemical vapor deposition (RPCVD), rapid thermal chemical vapor deposition (RTCVD), low pressure CVD (LPCVD), atmospheric pressure chemical vapor deposition (APCVD), molecular beam epitaxy (MBE), vapor phase epitaxy (VPE) or liquid phase epitaxy (LPE), low-energy plasma deposition (LEPD), ultra-high vacuum chemical vapor deposition (UHVCVD), or metal-organic CVD (MOCVD). The vertical fin layer 120 can have the same crystal structure and orientation as the underlying substrate 110.

In various embodiments, the vertical fin layer 120 can be a semiconductor material with a low doping concentration, where a low dopant concentration can be in the range of about $1\times10^{18}$ to about $1\times10^{20}$, or about $4\times10^{18}$ to about $2\times10^{19}$, or about $5\times10^{18}$ to about $1\times10^{19}$. The vertical fin layer 120 can be doped in situ (i.e., during formation of the vertical fin layer 120), or ex situ (i.e., after formation of the vertical fin layer 120). The dopant can be introduced into the vertical fin layer 120, for example, by ion implantation, gas phase doping, liquid phase doping, solid phase doping, plasma doping, plasma immersion ion implantation, cluster doping, infusion doping, or combinations thereof. The dopant can be an n-type dopant or a p-type dopant. In various embodiments, the vertical fin layer 120 can be the same semiconductor material as the substrate 110.

In one or more embodiments, the vertical fin layer 120 can have a thickness in a range of about 20 nanometers (nm) to about 150 nm, or about 30 nm to about 60 nm, although other thicknesses are also contemplated. The thickness of the vertical fin layer 120 can determine the height of subsequently formed vertical fins.

Figure 2:
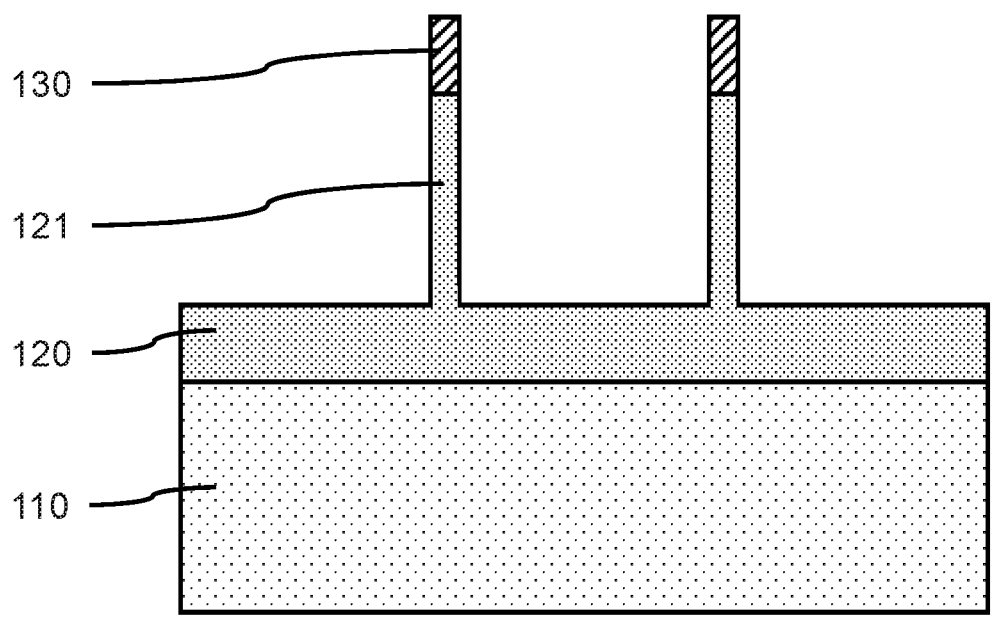
FIG. 2 is a cross-sectional side view showing a plurality of vertical fins formed on the vertical fin layer, in accordance with an embodiment of the present invention.

FIG. 2 is a cross-sectional side view showing a plurality of vertical fins formed on the vertical fin layer, in accordance with an embodiment of the present invention.

In one or more embodiments, a plurality of vertical fins 121 can be formed on the substrate 110, where the vertical fins 121 can be formed from the vertical fin layer 120 by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins 121 may be formed by a direct write process or double patterning process using, for example, immersion lithography, extreme ultraviolet lithography, or x-ray lithography.

In one or more embodiments, a fin template 130 can be formed on the vertical fins as part of the patterning process. The fin template 130 can be on the top surface of the vertical fin 121, where the fin templates can be a hardmask. The hardmask material can be a dielectric material, including, but not limited to, silicon oxide ($SiO_x$), carbon doped silicon oxide (SiO:C), silicon nitride ($Si_xN_y$), silicon oxynitride ($Si_xO_yN_z$), silicon carbonitride ($Si_xC_yN_z$), silicon boronitride ($Si_xB_yN_z$), silicon borocarbide ($Si_xB_yC_z$), silicon borocarbonitride ($Si_wB_xC_yN_z$), or combinations thereof. The fin templates can be selectively etchable relative to the vertical fins 121 and substrate 110.

In various embodiments, the vertical fins 121 can have a width in a range of about 4 nm to about 20 nm, or about 5 nm to about 8 nm, although other widths are also contemplated.

In one or more embodiments, the vertical fins 121 can have a height in a range of about 15 nanometers (nm) to about 145 nm, or about 25 nm to about 55 nm, although other heights are also contemplated.

In various embodiments, a remaining portion of the vertical fin layer 120 below the vertical fins 121 can have a thickness in a range of about 5 nm to about 50 nm, or about 10 nm to about 30 nm, although other thicknesses are also contemplated. Formation of the vertical fins 121 can involve etching down into the vertical fin layer 120, where the etching does not extend into the substrate 110.

Figure 3:
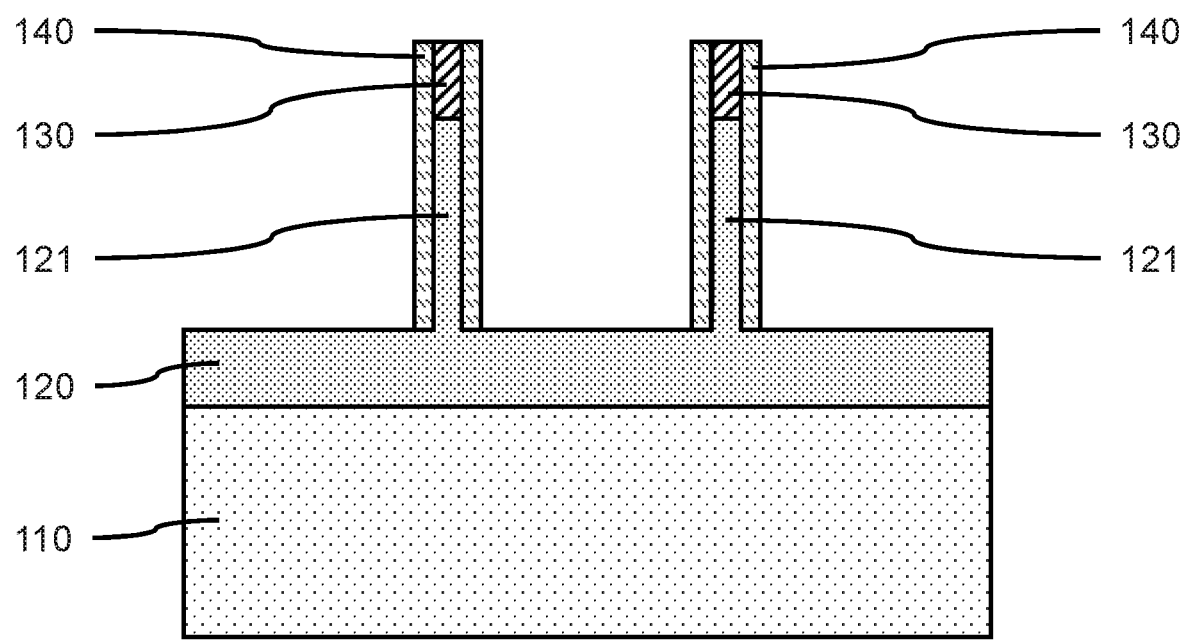
FIG. 3 is a cross-sectional side view showing a recess liner on each of the vertical fins, in accordance with an embodiment of the present invention.

FIG. 3 is a cross-sectional side view showing a recess liner on each of the vertical fins, in accordance with an embodiment of the present invention.

In one or more embodiments, a recess liner 140 can be formed on each of the vertical fins 121, where the recess liner 140 can be formed by a conformal deposition, for example, atomic layer deposition (ALD) or plasma enhanced ALD (PEALD). Portions of the recess liner 140 formed on the remaining portion of the vertical fin layer 120 and the top surface of the fin templates 130 can be removed using a selective, directional etch, for example, a reactive ion etch (RIE). The directional etch can leave the portion of the recess liner 140 on the sidewalls and end walls of the vertical fins 121 above the vertical fin layer 120, while exposing the surface of the remaining portion of the vertical fin layer 120.

In various embodiments, the recess liner 140 can be a dielectric material, for example, silicon oxide ($SiO_x$), carbon doped silicon oxide (SiO:C), silicon nitride ($Si_xN_y$), silicon oxynitride ($Si_xO_yN_z$), silicon carbonitride ($Si_xC_yN_z$), silicon boronitride ($Si_xB_yN_z$), silicon borocarbide ($Si_xB_yC_z$), silicon boro carbonitride ($Si_wB_xC_yN_z$), or combinations thereof.

In various embodiments, the recess liner 140 can have a thickness in a range of about 1 nm to about 10 nm, or about 2 nm to about 6 nm, although other thicknesses are also contemplated. The recess liner 140 can have a thickness sufficient to withstand down-stream cleaning and etching processes.

Figure 4:
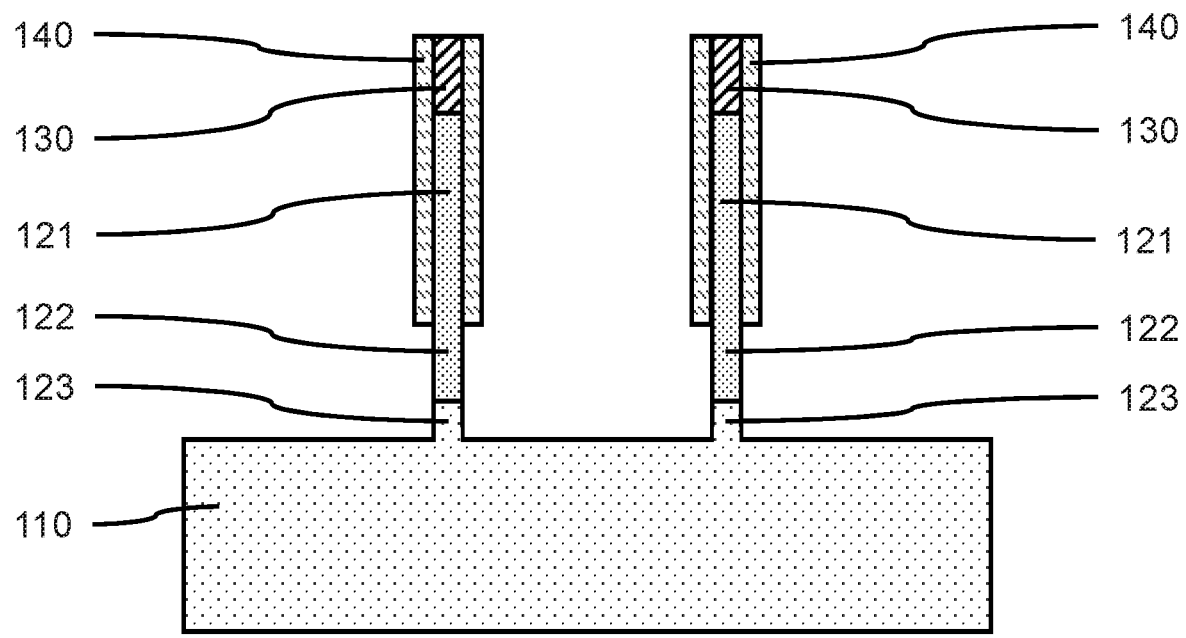
FIG. 4 is a cross-sectional side view showing an exposed lower portion of the vertical fins and an extension region between the lower vertical fin portion and a recessed substrate surface, in accordance with an embodiment of the present invention.

FIG. 4 is a cross-sectional side view showing an exposed lower portion of the vertical fins and an extension region between the lower vertical fin portion and a recessed substrate surface, in accordance with an embodiment of the present invention.

In one or more embodiments, the portion of the vertical fin layer 120 remaining below the recess liner 140 can be removed to form a lower fin region 122, where the vertical fin layer 120 can be removed using a directional etch (e.g., RIE) followed by an isotropic etch (e.g., dry or wet etch) to remove material overhung by the recess liner 140, so the epitaxial formation of subsequent layers can be closer to a device channel. The isotropic etch can recess the vertical fin layer 120, so the lower fin region 122 is flush with the sides of the vertical fin 121 covered by the recess liner.

In various embodiments, a portion of the substrate 110 can be removed to form an extension region 123 below the lower fin region 122. The portion of the substrate 110 can be removed using a directional etch (e.g., RIE) followed by an isotropic etch (e.g., dry or wet etch). The isotropic etch can recess the substrate 110, so the extension region 123 is flush with the lower fin region 122 and the portion of the vertical fin 121 covered by the recess liner 140.

In various embodiments, the portion of the substrate 110 and vertical fin layer 120 removed can form a lower fin region 122 and extension region 123 with a combined height in the range of about 10 nm to about 50 nm, or about 20 nm to about 40 nm, or about 30 nm, although other heights are also contemplated.

Figure 5:
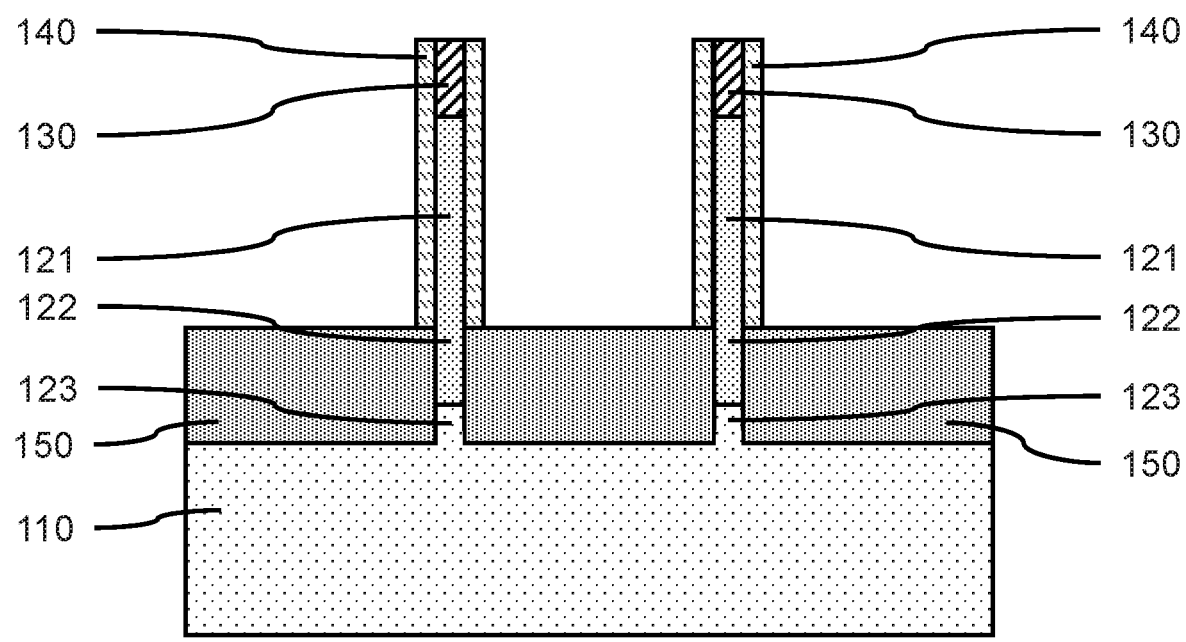
FIG. 5 is a cross-sectional side view showing a bottom source/drain layer formed on the substrate and lower vertical fin portions, in accordance with an embodiment of the present invention.

FIG. 5 is a cross-sectional side view showing a bottom source/drain layer formed on the substrate and lower vertical fin portions, in accordance with an embodiment of the present invention.

In one or more embodiments, a bottom source/drain layer 150 can be formed on the exposed surface of the substrate, where the bottom source/drain layer 150 can be formed by epitaxial or heteroepitaxial growth on the exposed substrate surface (for the sack of consistency, epitaxy and epitaxial will be used to cover both epitaxial and heteroepitaxial growth processes). The bottom source/drain layer 150 can be formed to a height that covers the sidewalls and end walls of the extension region 123 and the lower fin region 122, where the height (thickness) of the bottom source/drain layer 150 can be controlled by the growth time.

In various embodiments the bottom source/drain layer 150 can have a thickness in the range of about 10 nm to about 50 nm, or about 20 nm to about 40 nm, or about 30 nm, although other thicknesses are also contemplated.

Figure 6:
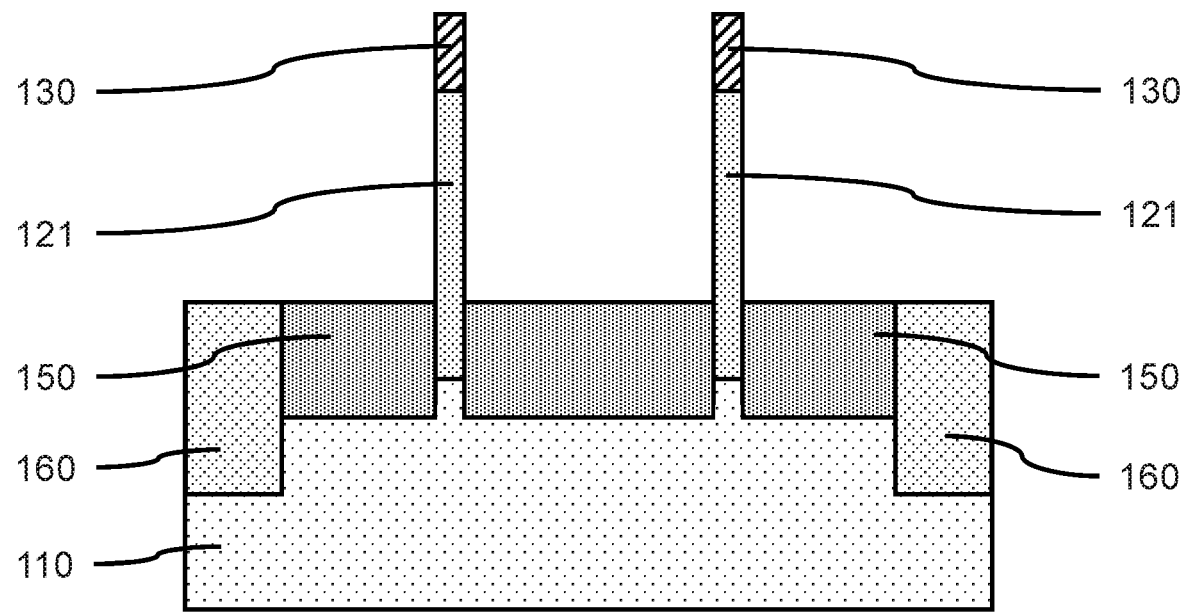
FIG. 6 is a cross-sectional side view showing isolation regions formed in the bottom source/drain layer and substrate, in accordance with an embodiment of the present invention.

FIG. 6 is a cross-sectional side view showing isolation regions formed in the bottom source/drain layer and substrate, in accordance with an embodiment of the present invention.

In one or more embodiments, the recess liner 140 can be removed from the vertical fins 121 and fin templates 140. The recess liner 140 can be removed using a selective isotropic etch.

In one or more embodiments, the vertical fins 121 and portions of the bottom source/drain layer 150 an be masked using a hardmask and/or lithographic resist to form isolation trenches through the bottom source/drain layer 150 and into the underlying substrate 110. The isolation trenches can be filled with an insulating, dielectric material, for example silicon oxide ($SiO_x$), silicon nitride ($Si_xN_y$), silicon oxynitride ($Si_xO_yN_z$), a low-K dielectric material, or a combination thereof to form an isolation region 160. A low-K dielectric can include amorphous carbon (a-C), fluorine doped silicon oxide (SiO:F), carbon doped silicon oxide (SiO:C), SiCOH, silicon boro carbonitride (SiBCN), or a combination thereof.

Figure 7:
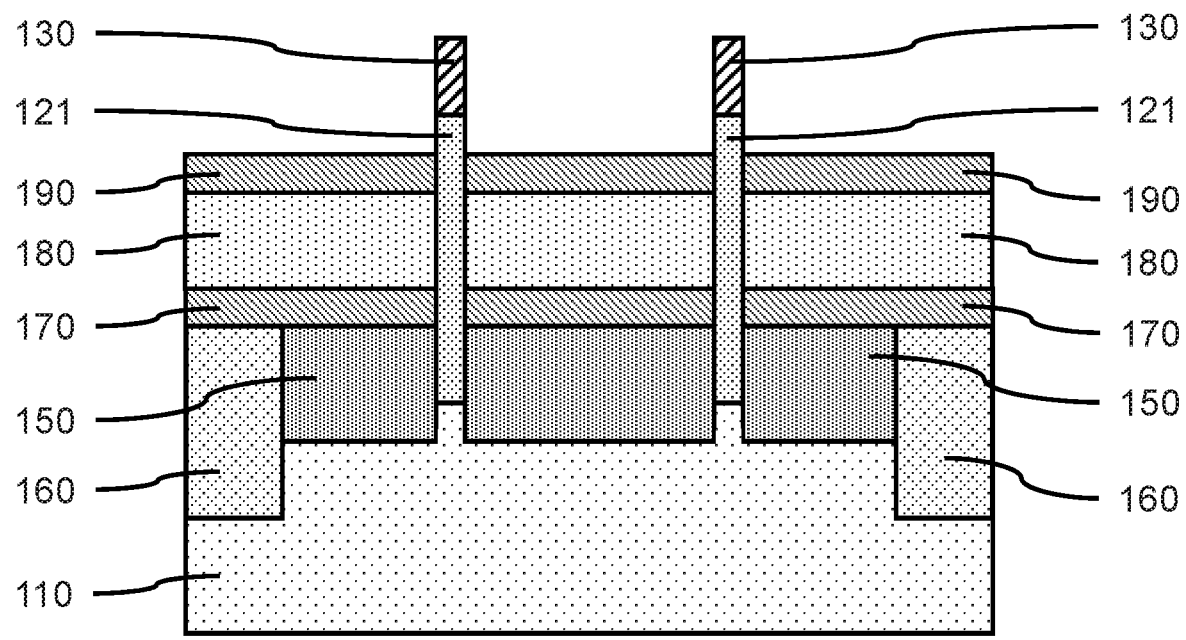
FIG. 7 is a cross-sectional side view showing a bottom spacer layer formed on the bottom source/drain layer, a dummy gate layer formed on the bottom spacer layer, and a top spacer layer formed on the dummy gate layer, in accordance with an embodiment of the present invention.

FIG. 7 is a cross-sectional side view showing a bottom spacer layer formed on the bottom source/drain layer, a dummy gate layer formed on the bottom spacer layer, and a top spacer layer formed on the dummy gate layer, in accordance with an embodiment of the present invention.

In one or more embodiments, a bottom spacer layer 170 can be formed on the exposed surfaces of the isolation region 160 and bottom source/drain layer 150. The bottom spacer layer can be formed by a directional deposition, for example, gas cluster ion beam deposition (GCIB) deposition or a high density plasma (HDP) deposition. An isotropic etch of the bottom spacer material can be used to remove unwanted coverage on the sides of vertical fins 121.

In various embodiments, the bottom spacer layer 170 can have a thickness in the range of about 4 nm to about 15 nm, or about 5 nm to about 10 nm, or about 6 nm, although other thicknesses are also contemplated.

In various embodiments, the bottom spacer layer 170 can be a dielectric material, including, but not limited to, silicon oxide ($SiO_x$), carbon doped silicon oxide (SiO:C), silicon nitride ($Si_xN_y$), silicon oxynitride ($Si_xO_yN_z$), silicon carbonitride ($Si_xC_yN_z$), silicon boronitride ($Si_xB_yN_z$), silicon borocarbide ($Si_xB_yC_z$), silicon boro carbonitride ($Si_wB_xC_yN_z$), or combinations thereof.

In one or more embodiments, a dummy gate layer 180 can be formed on the bottom spacer layer 170, where the dummy gate layer 180 can be formed by a directional deposition, followed by an etch-back to achieve an intended height (thickness) of the dummy gate layer 180.

In various embodiments, the dummy gate layer can be amorphous silicon (a-Si), amorphous carbon (a-C), silicon germanium (SiGe), or silicon oxide ($SiO_x$).

In various embodiments, the dummy gate layer 180 can have a thickness in the range of about 10 nm to about 50 nm, or about 15 nm to about 35 nm, or about 20 nm, although other thicknesses are also contemplated. The thickness of the dummy gate layer 180 can determine the effective gate length of a subsequently formed gate structure on the vertical fin 121.

In one or more embodiments, a top spacer layer 190 can be formed on the dummy gate layer 180, where the top spacer layer 190 can be formed by a directional deposition, for example, gas cluster ion beam deposition (GCIB) deposition or a high density plasma (HDP) deposition, followed by an isotropic etch of the bottom spacer material to remove unwanted coverage on the sides of fins.

In various embodiments, the top spacer layer 190 can have a thickness in the range of about 4 nm to about 15 nm, or about 5 nm to about 10 nm, or about 6 nm, although other thicknesses are also contemplated.

In various embodiments, the top spacer layer 190 can be a dielectric material, including, but not limited to, silicon oxide ($SiO_x$), carbon doped silicon oxide (SiO:C), silicon nitride ($Si_xN_y$), silicon oxynitride ($Si_xO_yN_z$), silicon carbonitride ($Si_xC_yN_z$), silicon boronitride ($Si_xB_yN_z$), silicon borocarbide ($Si_xB_yC_z$), silicon boro carbonitride ($Si_wB_xC_yN_z$), or combinations thereof.

Figure 8:
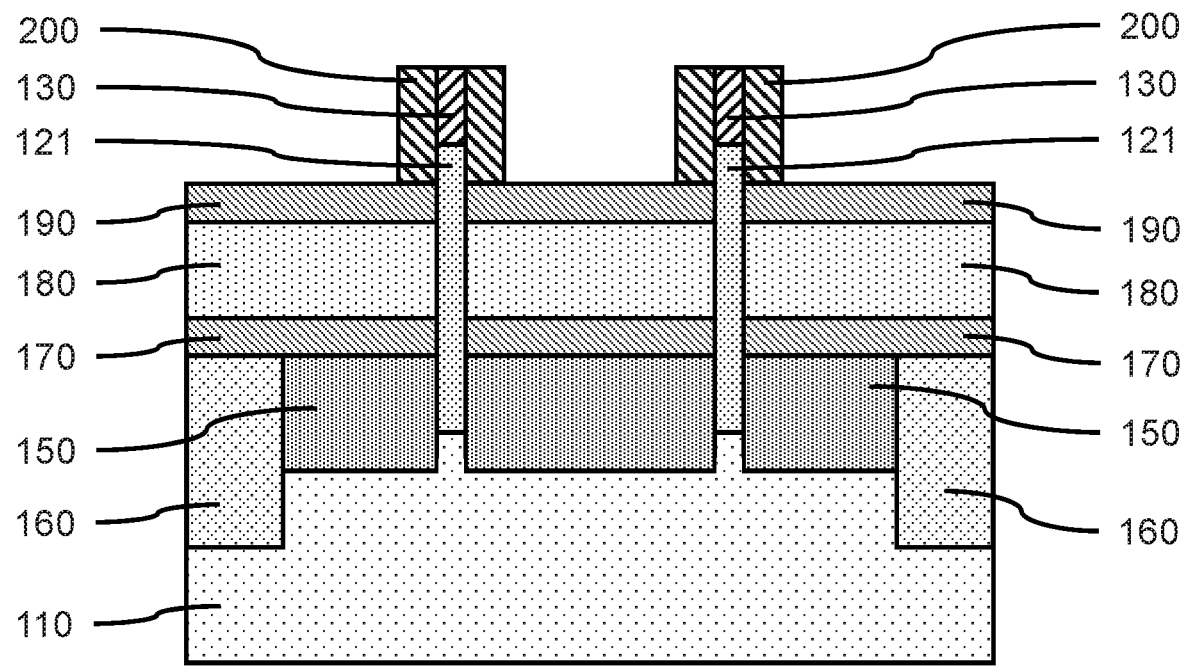
FIG. 8 is a cross-sectional side view showing gate cut templates on an upper portion of the vertical fins and fin templates, in accordance with an embodiment of the present invention.

FIG. 8 is a cross-sectional side view showing gate cut templates on an upper portion of the vertical fins and fin templates, in accordance with an embodiment of the present invention.

In one or more embodiments, a gate cut template 200 can be formed on an upper portion of each of the vertical fins 121 and fin templates 130, where the gate cut templates 200 can be formed by deposition of a gate cut template layer, for example, by chemical vapor deposition (CVD), plasma enhanced CVD (PECVD), physical vapor deposition (PVD), atomic layer deposition (ALD), or a combination thereof, followed by a directional etch (e.g., RIE).

The gate cut layer and gate cut templates 200 can be a hardmask, for example, silicon nitride ($Si_xN_y$) or silicon oxynitride ($Si_xO_yN_z$).

In various embodiments, the gate cut templates 200 can extend a distance of about 5 nm to about 20 nm from each side of the fin template 130 and vertical fin 121 to define an area around the vertical fin 121 for forming a gate structure.

Figure 9:
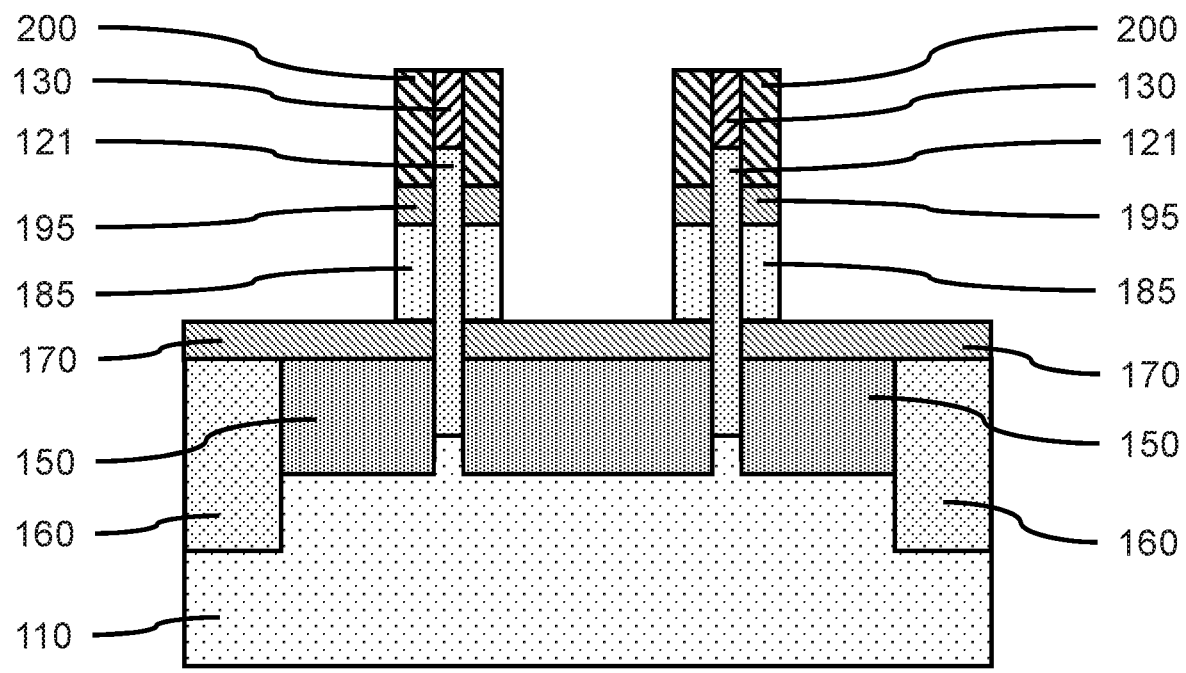
FIG. 9 is a cross-sectional side view showing a dummy gate block on the bottom spacer layer and a top spacer on the dummy gate block, in accordance with an embodiment of the present invention.

FIG. 9 is a cross-sectional side view showing a dummy gate block on the bottom spacer layer and a top spacer on the dummy gate block, in accordance with an embodiment of the present invention.

In one or more embodiments, portions of the top spacer layer 190 not covered by the gate cut template 200 can be removed using a selective directional etch (e.g., RIE) to form a top spacer 195 around each of the vertical fins 121 and on the dummy gate layer 180.

In one or more embodiments, portions of the dummy gate layer 180 not covered by the gate cut template 200 and top spacer 195 can be removed using a selective directional etch (e.g., RIE) to form a dummy gate block 185 around the each of the vertical fins 121, and on the bottom spacer layer 170.

Figure 10:
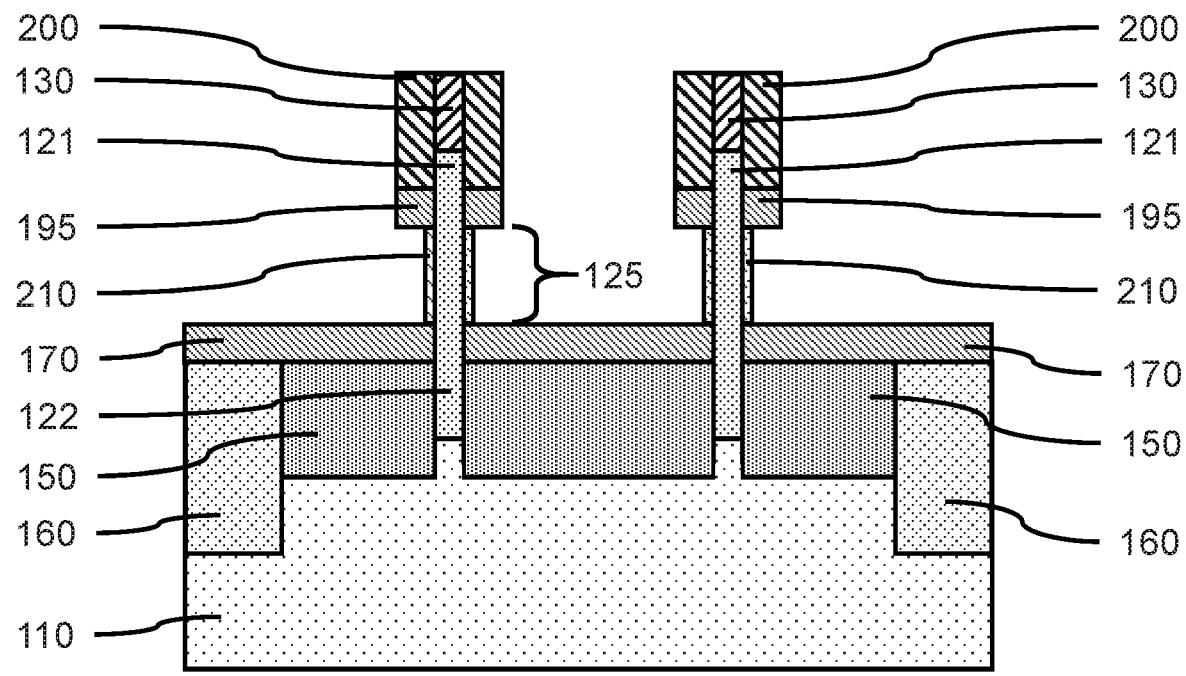
FIG. 10 is a cross-sectional side view showing an absorption layer formed on the middle vertical fin region of each vertical fin after removing the dummy gate block, in accordance with an embodiment of the present invention.

FIG. 10 is a cross-sectional side view showing an absorption layer formed on the middle vertical fin region of each vertical fin after removing the dummy gate block, in accordance with an embodiment of the present invention.

In one or more embodiments, the dummy gate block 185 can be removed using a selective isotropic etch, for example, a wet chemical etch or a dry plasma etch, to expose a middle vertical fin region 125 between the bottom surface of the top spacer 195 and the top surface of the bottom spacer layer 170. An upper portion of the vertical fin 121 can be above the top surface of the dummy gate block 185, and a lower portion of the vertical fin including the lower fin region 122 can be below the top surface of the bottom spacer layer 170.

In one or more embodiments, an absorption layer 210 can be formed on the exposed sidewalls and end walls of the vertical fins 121 in the middle vertical fin region 125. The absorption layer 210 can be formed by a rapid thermal oxide growth (RTO) process to form an in-situ steam generation (ISSG) oxide layer through wet oxidation. The absorption layer 210 can be formed from the exposed material of the vertical fins 121, where the absorption layer 210 can be confined to the exposed surface between the bottom surface of the top spacer 195 and the top surface of the bottom spacer layer 170.

In various embodiments, the absorption layer 210 can be formed by a conformal deposition (e.g., ALD, PEALD), where the absorption layer 210 can be materials, including, but not limited to, silicon oxide (SiO), carbon doped silicon oxide (SiO:C), amorphous silicon, or combinations thereof.

In one or more embodiments, the absorption layer 210 can have a thickness in the range of about 1 nm to about 10 nm, or about 2 nm to about 6 nm, or about 3 nm, although other thicknesses are also contemplated. The absorption layer 210 can be sufficiently thick to absorb a predetermined amount of dopants from the adjacent middle region 125 of the vertical fin 121.

Figure 11:
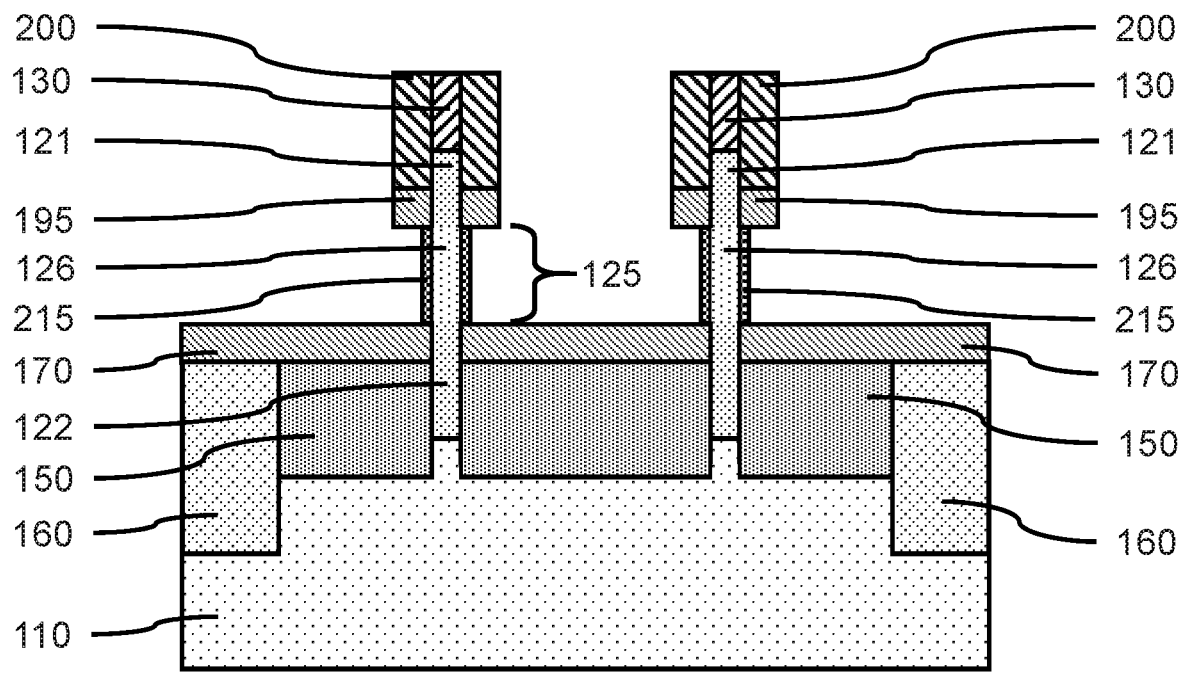
FIG. 11 is a cross-sectional side view showing a dopant modified absorption layer after a heat treatment, in accordance with an embodiment of the present invention.

FIG. 11 is a cross-sectional side view showing a dopant modified absorption layer after a heat treatment, in accordance with an embodiment of the present invention.

In one or more embodiments, the substrate 110, vertical fins 121, absorption layer 210, bottom source/drain layer 150, bottom spacer layer 170, top spacer 195, fin templates 130, and gate cut templates 200 can be heat treated, where dopants diffuse/segregate from the vertical fin 121 to the absorption layer 210 due to the dopant solid solubility in the absorption layer and a dopant concentration gradient.

In various embodiments, the heat treatment can be an anneal at a temperature in a range of about 700° C. to about 1200° C., or in a range of about 800° C. to about 1000° C. The anneal can be conducted for a period of time in the range of about 0.01 seconds (sec) to about 10 sec. The heat treatment can convert the absorption layer 210 into a dopant modified absorption layer 215, where the dopant modified absorption layer 215 can have a dopant concentration greater than zero (0) due to diffusion/segregation of dopants from the middle vertical fin region 125 of the vertical fin 121 into the absorption layer 210. The dopant solid solubility and thickness of the absorption layer 210, along with the temperature and duration of the heat treatment, can determine the amount of dopants that can be absorbed.

After diffusion/segregation and formation of the dopant modified absorption layer 215, the dopant modified absorption layer 215 can be removed by a selective, isotropic etch (e.g., wet chemical etch, dry plasma etch). Removal of the dopant modified absorption layer 215 can expose the middle vertical fin region 125 between the upper portion of the vertical fin and the lower portion of the vertical fin.

In various embodiments, diffusion of dopants out of the middle vertical fin region 125 can form a reduced dopant region 126 having a dopant concentration less than the dopant concentration of the upper portion of the vertical fin and the lower portion of the vertical fin. The dopant concentration of the reduced dopant region 126 can be in the range of about $1 \times 10^{16}$ to about $1 \times 10^{18}$, or about $5 \times 10^{16}$ to about $5 \times 10^{17}$, after the heat treatment. The reduced dopant region 126 can be between the upper portion of a vertical fin 121 and the lower fin region 122.

Figure 12:
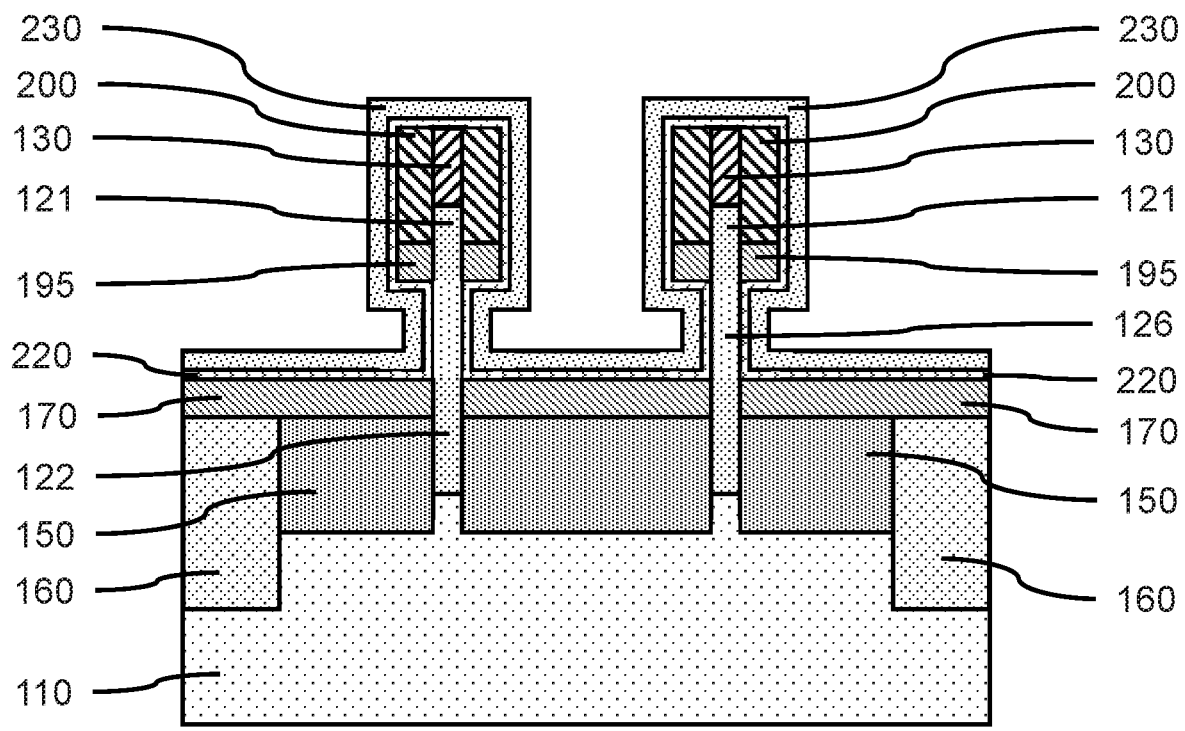
FIG. 12 is a cross-sectional side view showing a gate dielectric layer and a conductive gate layer on the substrate, middle vertical fin region, and gate cut layer, in accordance with an embodiment of the present invention.

FIG. 12 is a cross-sectional side view showing a gate dielectric layer and a conductive gate layer on the substrate, middle vertical fin region, and gate cut layer, in accordance with an embodiment of the present invention.

In one or more embodiments, a gate dielectric layer 220 can be formed on the exposed surfaces of the middle vertical fin region 125, where the gate dielectric layer 220 can be formed by a conformal deposition (e.g., ALD, PEALD), thermal oxidation, chemical oxidation, or a combination thereof. The gate dielectric layer 220 can also be on the exposed surfaces of the bottom spacer layer 170, top spacer 195, and gate cut templates 200.

In one or more embodiments, a gate dielectric layer 220 can be a dielectric material, including, but not limited to, silicon oxide ($SiO_x$), silicon nitride ($Si_xN_y$), silicon oxynitride ($Si_xO_yN_z$), boron nitride (BN), high-k dielectric materials, or a combination thereof. Examples of high-k materials include but are not limited to metal oxides, such as, hafnium oxide ($HfO_x$), hafnium silicon oxide ($Hf_xSi_yO_z$), hafnium silicon oxynitride ($Hf_wSi_xO_yN_z$), lanthanum oxide ($LaO_x$), lanthanum aluminum oxide ($La_xAl_yO_z$), zirconium oxide ($ZrO_x$), zirconium silicon oxide ($Zr_xSi_yO_z$), zirconium silicon oxynitride ($Zr_wSi_xO_yN_z$), tantalum oxide ($TaO_x$), titanium oxide ($TiO_x$), barium strontium titanium oxide ($Ba_wSr_xTi_yO_z$), barium titanium oxide ($Ba_xTi_yO_z$), strontium titanium oxide ($Sr_xTi_yO_z$), yttrium oxide ($Y_xO_y$), aluminum oxide ($Al_xO_y$), lead scandium tantalum oxide ($Pb_wSc_xTa_yO_z$), and lead zinc niobate ($Pb_wZn_xNb_yO_z$). The high-k material may further include dopants such as lanthanum, aluminum, magnesium, or combinations thereof.

In various embodiments, the gate dielectric layer 220 can have a thickness in the range of about 1 nm to about 6 nm, or about 2.5 nm, although other thicknesses are also contemplated.

In one or more embodiments, a conductive gate layer 230 can be formed on the gate dielectric layer 220, where the conductive gate layer 230 can be formed by a conformal deposition (e.g., ALD, PEALD).

In various embodiments, the conductive gate layer 230 can be a metal, for example, tungsten (W), copper (Cu), cobalt (Co), tantalum (Ta), titanium (Ti), manganese (Mn); a conductive metal compound, for example, tantalum nitride (TaN), titanium nitride (TiN), titanium carbide (TiC), Al-doped titanium carbide (TiAlC), a copper manganese alloy (Cu—Mn), or any suitable combination thereof.

In various embodiments, the conductive gate layer 230 can have a thickness in the range of about 3 nm to about 20 nm, or about 5 nm to about 15 nm, or about 8 nm, although other thicknesses are also contemplated.

Figure 13:
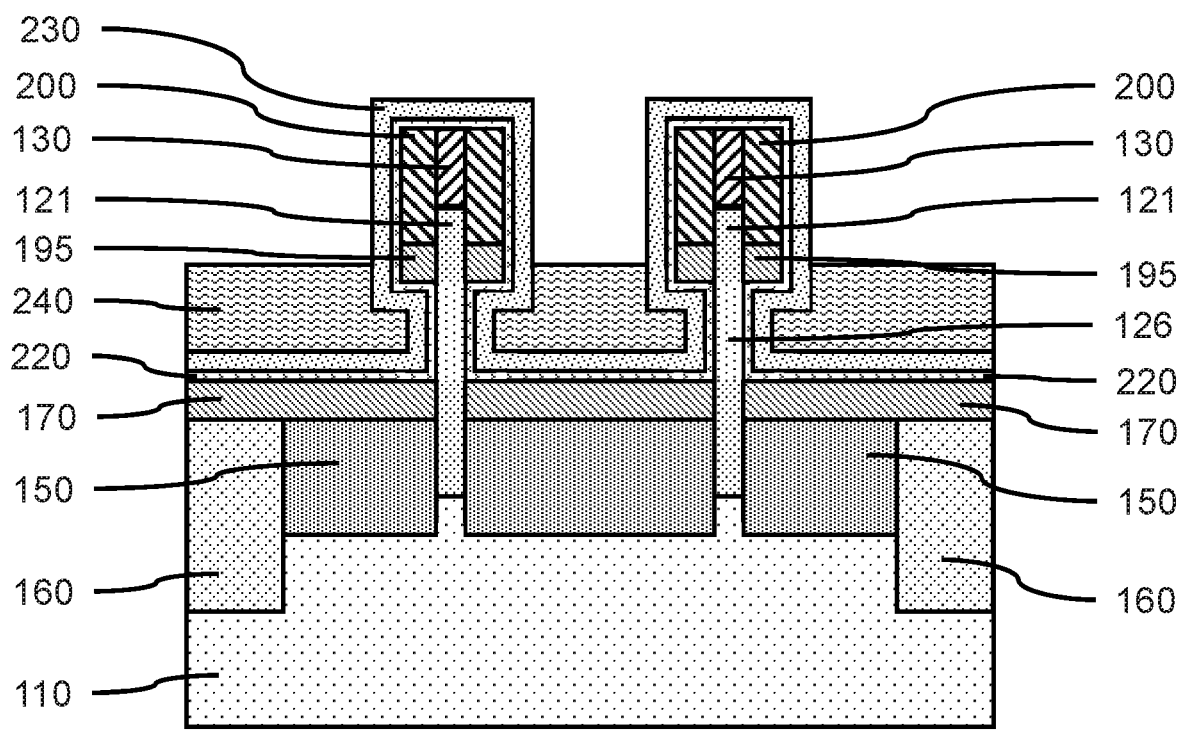
FIG. 13 is a cross-sectional side view showing a gauge layer on the gate dielectric layer and conductive gate layer, in accordance with an embodiment of the present invention.

FIG. 13 is a cross-sectional side view showing a gauge layer on the gate dielectric layer and conductive gate layer, in accordance with an embodiment of the present invention.

In one or more embodiments, a gauge layer 240 can be formed on the conductive gate layer 230, where the gauge layer 240 can be formed by a blanket deposition (e.g., CVD, PECVD, spin-on). In various embodiments, the gauge layer 240 can be formed by CVD, LPCVD, or spun on.

In various embodiments, the gauge layer 240 can be a flowable oxide, a spin-on-carbon (SOC), a low-k dielectric material, an organic planarization layer (OPL), or a combination thereof. A low-k dielectric material can include, but not be limited to, a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

In various embodiments, the gauge layer 240 can be etched back using a directional etch (e.g., RIE) to reduce the height of the gauge layer and expose portions of the conductive gate layer 230. The gauge layer 240 can be etched back to a height where the top surface of the gauge layer 240 is between the top and bottom surfaces of the top spacers 195.

Figure 14:
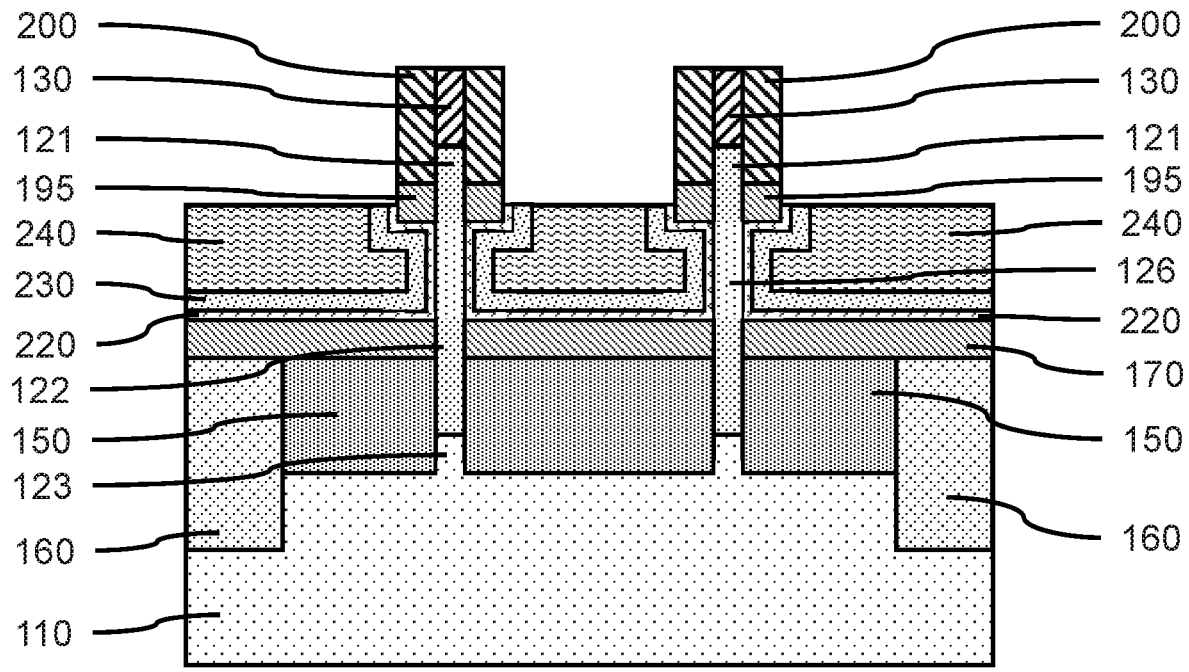
FIG. 14 is a cross-sectional side view showing a recessed gate dielectric layer and conductive gate layer on the substrate, middle vertical fin region, and top spacer, in accordance with an embodiment of the present invention.

FIG. 14 is a cross-sectional side view showing a recessed gate dielectric layer and conductive gate layer on the substrate, middle vertical fin region, and top spacer, in accordance with an embodiment of the present invention.

In one or more embodiments, the exposed portion of the conductive gate layer 230 can be removed using a selective isotropic etch (e.g., wet etch) to expose the underlying gate dielectric layer 220. The exposed portion of the gate dielectric layer 220 can then be removed using a selective isotropic etch to expose the gate cut templates 200 and a portion of the top spacer 195.

The portions of the gate dielectric layer 220 and conductive gate layer 230 can form a vertical gate structure on the middle vertical fin region 125, where the effective gate length can be the distance between the bottom surface of the top spacer 195 and the top surface of the bottom spacer layer 170, as affected by the reduction of the dopant concentration in the middle vertical fin region 125 forming the reduced dopant region 126.

Figure 15:
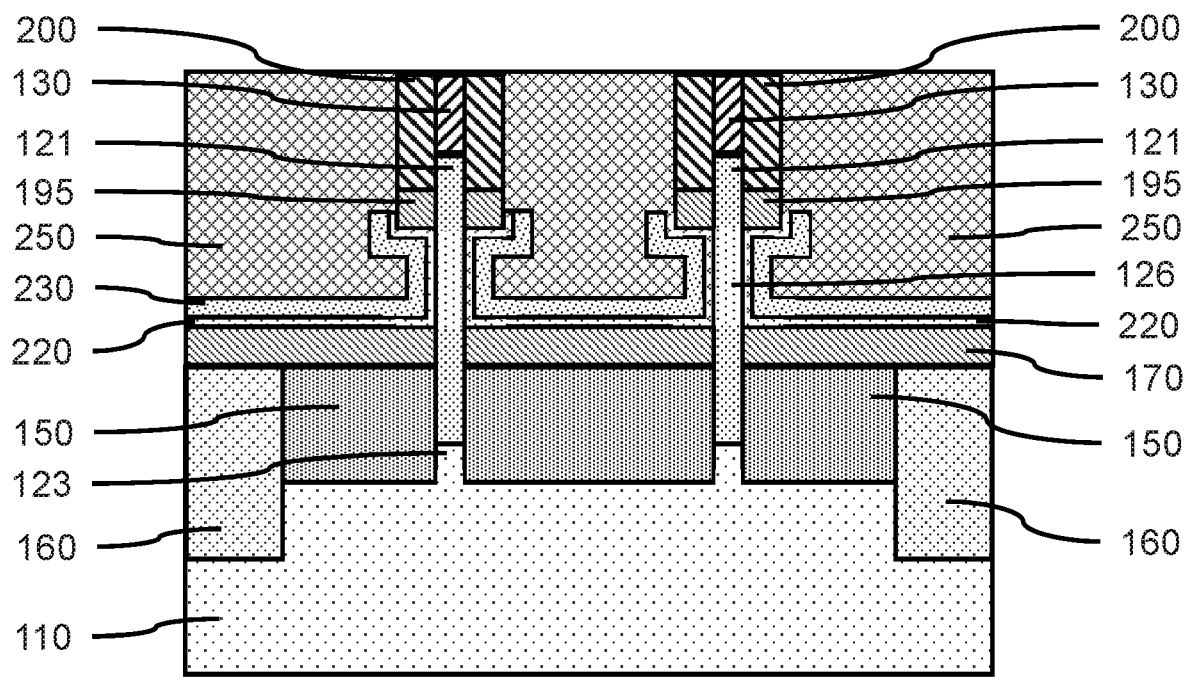
FIG. 15 is a cross-sectional side view showing an interlayer dielectric (ILD) layer on the recessed gate dielectric layer and conductive gate layer after removing the gauge layer, in accordance with an embodiment of the present invention.

FIG. 15 is a cross-sectional side view showing an interlayer dielectric (ILD) layer on the recessed gate dielectric layer and conductive gate layer after removing the gauge layer, in accordance with an embodiment of the present invention.

In one or more embodiments, an interlayer dielectric (ILD) layer 250 can be formed on the recessed gate dielectric layer 220 and conductive gate layer 230 after removing the gauge layer 240, where the gauge layer 240 can be removed using a selective isotropic etch (e.g., wet etch). The interlayer dielectric (ILD) layer 250 can be formed by a blanket deposition (e.g., CVD, PECVD).

In various embodiments, the ILD layer 250 can be a silicon oxide (SiO) or a low-k dielectric material. In various embodiments, a low-k dielectric material may be a fluoride-doped silicon oxide (e.g., fluoride doped glass), a carbon-doped silicon oxide, a porous silicon oxide, silicon oxynitride ($Si_xO_yN_z$), silicon carbonitride ($Si_xC_yN_z$), a spin-on silicon based polymeric material (e.g., tetraethyl orthosilicatehydrogen (TEOS), silsesquioxane (HSQ) and methyl-silsesquioxane (MSQ)), or combinations thereof.

In various embodiments, a chemical-mechanical polishing (CMP) can be used to remove an upper portion of the ILD layer 250 and expose the top surfaces of the fin templates 130 and gate cut templates 200.

Figure 16:
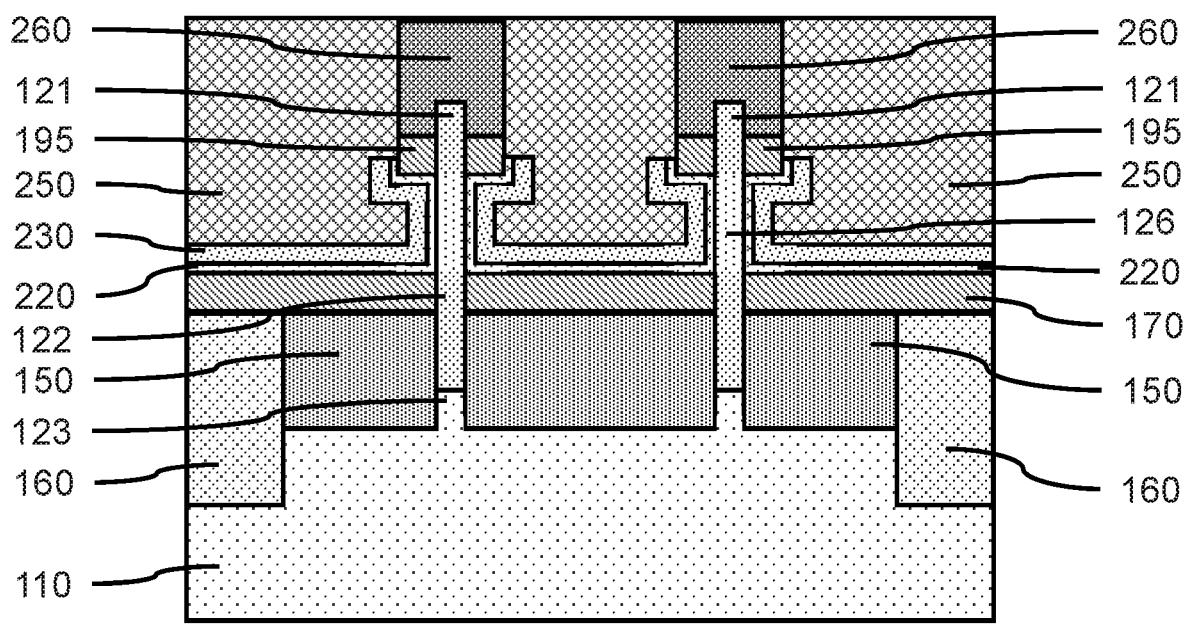
FIG. 16 is a cross-sectional side view showing a top source/drain on each of the plurality of vertical fins above the top spacers, in accordance with an embodiment of the present invention.

FIG. 16 is a cross-sectional side view showing a top source/drain on each of the plurality of vertical fins above the top spacers, in accordance with an embodiment of the present invention.

In one or more embodiments, the exposed fin templates 130 and gate cut templates 200 can be removed using a selective isotropic etch to expose the upper portion of the vertical fins 121. The fin templates 130 and gate cut templates 200 may be the same material to allow removal at the same time.

In various embodiments, a top source/drain 260 can be formed on the exposed portions of the vertical fins 121, where the top source/drains 260 can be formed by epitaxial growth on the exposed portions of the vertical fins 121. The top source/drain 260 can be a doped semiconductor material, where the dopant can be n-type or p-type depending on the type of vertical field effect transistors (VFETs) being fabricated.

In various embodiments, the reduced dopant region 126, gate dielectric layer 220 between the top spacer 195 and bottom spacer layer 170, and the conductive gate layer 230 on the gate dielectric layer 220 can form a vertical gate structure with an effective gate length in a range of about 10 nm to about 100 nm, or in a range of about 10 nm to about 50 nm, although other lengths are also contemplated.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper." and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of controlling an effective gate length in a vertical field effect transistor, comprising:
    forming a dummy gate block and top spacer on a bottom spacer layer, wherein the dummy gate block and the top spacer are adjacent to a vertical fin, wherein the vertical fin includes a dopant species extending from a top surface of the top spacer to a bottom surface of the bottom spacer layer;
    removing the dummy gate block to expose a portion of the vertical fin between the top spacer and bottom spacer layer;
    forming an absorption layer on the exposed portion of the vertical fin;
    heat treating the absorption layer and the vertical fin to cause at least a portion of the dopant species to diffuse/segregate from the vertical fin to the absorption layer to form a dopant modified absorption layer; and
    removing the dopant modified absorption layer.

2. The method of claim 1, wherein the absorption layer is formed by a rapid thermal oxidation or atomic layer deposition (ALD).

3. The method of claim 1, wherein the absorption layer is an in-situ steam generation (ISSG) oxide layer formed through wet oxidation of the exposed portion of the vertical fin.

4. The method of claim 1, wherein the heat treatment is conducted at a temperature in a range of about 700° C. to about 1200° C.

5. The method of claim 4, wherein the vertical fin includes the dopant species in a concentration in a range of about $1 \times 10^{18}$ atoms/cm$^{-3}$ to about $1 \times 10^{20}$ atoms/cm$^{-3}$.

6. The method of claim 1, further comprising forming a gate dielectric layer on the portion of the vertical fin exposed by removing the dopant modified absorption layer.

7. The method of claim 6, further comprising forming a conductive gate layer on the gate dielectric layer.

8. The method of claim 7, further comprising forming a top source/drain on the vertical fin.

9. The method of claim 8, wherein the dummy gate block has a thickness in a range of about 10 nm to about 50 nm.

10. A method of controlling an effective gate length in a vertical field effect transistor, comprising:
    forming a vertical fin from a doped layer including a dopant species;
    forming a dummy gate block and top spacer on a bottom spacer layer, wherein the dummy gate block and the top spacer are around the vertical fin on an extension region, wherein the vertical fin includes the dopant species;
    removing the dummy gate block to expose a portion of the vertical fin between the top spacer and bottom spacer layer;
    forming an absorption layer on the exposed portion of the vertical fin; and
    heat treating the absorption layer and the vertical fin to cause at least a portion of the dopant species to diffuse/segregate from the vertical fin to the absorption layer to form a dopant modified absorption layer.

11. The method of claim 10, further comprising removing the dopant modified absorption layer, and forming a gate dielectric layer on the portion of the vertical fin exposed by removing the dopant modified absorption layer.

12. The method of claim 11, further comprising forming a conductive gate layer on the gate dielectric layer.

13. The method of claim 12, further comprising forming a gauge layer with a top surface below the top surface of the top spacer on the conductive gate layer.

14. The method of claim 13, further comprising removing a portion of the conductive gate layer above the top surface of the gauge layer.

15. A method of controlling an effective gate length in a vertical field effect transistor, comprising:
    forming a vertical fin from a doped layer including a dopant species;
    forming a dummy gate block and top spacer on a bottom spacer layer, wherein the dummy gate block and the top spacer are around the vertical fin, wherein the vertical fin includes the dopant species extending from a top surface of the top spacer to a bottom surface of the bottom spacer layer;
    removing the dummy gate block to expose a portion of the vertical fin between the top spacer and bottom spacer layer;
    forming an absorption layer on the exposed portion of the vertical fin;

heat treating the absorption layer and the vertical fin to cause at least a portion of the dopant species to diffuse/segregate from the vertical fin to the absorption layer to form a dopant modified absorption layer and a reduced dopant region in the vertical fin, wherein the reduced dopant region has a dopant concentration is in a range of about $1\times10^{16}$ cm$^{-3}$ to about $1\times10^{18}$ cm$^{-3}$; and removing the dopant modified absorption layer.

16. The method of claim 15, wherein the dummy gate block has a thickness in a range of about 10 nm to about 50 nm.

17. The method of claim 16, further comprising forming a gate dielectric layer on the portion of the vertical fin exposed by removing the dopant modified absorption layer, and forming a conductive gate layer on the gate dielectric layer.

18. The method of claim 17, further comprising forming a top source/drain on the vertical fin.

19. The method of claim 18, wherein the reduced dopant region, gate dielectric layer, and conductive gate layer forms a vertical gate structure with an effective gate length in a range of about 10 nm to about 50 nm.

20. The method of claim 19, wherein the vertical fin is made of a semiconductor material selected from the group consisting of silicon (Si), silicon carbide (SiC), silicon-germanium (SiGe), germanium (Ge), gallium-arsenide (GaAs), indium-gallium-arsenide (InGaAs), indium-phosphide (InP), indium-antimonide (InSb), cadmium-telluride (CdTe), zinc-telluride (ZnTe), zinc sulfide (ZnS), and zinc selenide (ZnSe).

* * * * *